(12) United States Patent
Murayama et al.

(10) Patent No.: US 7,989,845 B2
(45) Date of Patent: Aug. 2, 2011

(54) SEMICONDUCTOR DEVICE HAVING A HETERO-JUNCTION BIPOLAR TRANSISTOR AND MANUFACTURING METHOD THEREOF

(75) Inventors: Keiichi Murayama, Toyama (JP); Akiyoshi Tamura, Osaka (JP); Hirotaka Miyamoto, Toyama (JP); Kenichi Miyajima, Toyama (JP)

(73) Assignee: Panasonic Corporation, Osaka (JP)

( * ) Notice: Subject to any disclaimer, the term of this patent is extended or adjusted under 35 U.S.C. 154(b) by 425 days.

(21) Appl. No.: 12/126,395

(22) Filed: May 23, 2008

(65) Prior Publication Data
US 2008/0296624 A1    Dec. 4, 2008

(30) Foreign Application Priority Data

Jun. 4, 2007    (JP) .................. 2007-148638

(51) Int. Cl.
*H01L 31/0328* (2006.01)
(52) U.S. Cl. ............... 257/197; 257/195; 257/E27.015
(58) Field of Classification Search ............ 257/183, 257/192, 194, 196–198
See application file for complete search history.

(56) References Cited

U.S. PATENT DOCUMENTS

| | | | |
|---|---|---|---|
| 4,821,090 A | 4/1989 | Yokoyama | |
| 6,043,519 A | 3/2000 | Shealy et al. | |
| 6,063,655 A | 5/2000 | Shealy et al. | |
| 6,919,590 B2 * | 7/2005 | Hill et al. | 257/192 |
| 2006/0284212 A1 | 12/2006 | Murayama et al. | |
| 2007/0145412 A1 | 6/2007 | Murayama et al. | |

FOREIGN PATENT DOCUMENTS

| | | |
|---|---|---|
| EP | 0144242 | 6/1985 |
| EP | 0829906 | 3/1998 |
| JP | 60-086872 | 5/1985 |
| JP | 60-120551 | 6/1985 |
| JP | 61-196579 | 8/1986 |
| JP | 01-108779 | 4/1989 |
| JP | 02-003937 | 1/1990 |
| JP | 03-138950 | 6/1991 |
| JP | 04-101431 | 4/1992 |
| JP | 05-235056 | 9/1993 |

(Continued)

OTHER PUBLICATIONS

Japanese Office Action dated Nov. 4, 2009 that issued with respect to patent family member Japanese Patent Application No. 2007-148638.

(Continued)

*Primary Examiner* — Thanh Nguyen
(74) *Attorney, Agent, or Firm* — Greenblum & Bernstein, P.L.C.

(57) ABSTRACT

The object of the present invention is to provide a semiconductor device and the manufacturing method thereof which are capable of preventing decrease in the collector breakdown voltage and reducing the collector resistance. The semiconductor device according to the present invention includes: a HBT formed on a first region of a semiconductor substrate; and an HFET formed on a second region of the semiconductor substrate, wherein the HBT includes: an emitter layer of a first conductivity; a base layer of a second conductivity that has a band gap smaller than that of the emitter layer; a collector layer of the first conductivity or a non-doped collector layer; and a sub-collector layer of the first conductivity which are formed sequentially on the first region, and the HFET includes an electron donor layer including a part of the emitter layer, and a channel layer formed under the electron donor layer.

15 Claims, 4 Drawing Sheets

FOREIGN PATENT DOCUMENTS

| | | |
|---|---|---|
| JP | 6-209077 | 7/1994 |
| JP | 6-291135 | 10/1994 |
| JP | 10-177953 | 6/1998 |

OTHER PUBLICATIONS

W.B. Chen, et al., (2003), IEEE Electron Device Letter, vol. 24, No. 10, pp. 619-621.

Hung-Tsao Hsu, et al., (2006), Semicond. Sci. Technol., vol. 21, pp. 1728-1732.

U.S. Appl. No. 12/400,376, "Semiconductor Device and Manufacturing Method Thereof," filed Mar. 9, 2009 (co-pending, commonly assigned).

An English language abstract thereof (provided by Patent Abstracts of Japan).

Japanese Office Action dated Nov. 4, 2009 that issued with respect to patent family member Japanese Patent Application No. 2007-148638.

* cited by examiner

SEMICONDUCTOR DEVICE HAVING A HETERO-JUNCTION BIPOLAR TRANSISTOR AND MANUFACTURING METHOD THEREOF

BACKGROUND OF THE INVENTION (1) Field of the Invention

The present invention relates to an HBT and HFET integrated circuit (Bi-HFET) used as a high-frequency semiconductor device and to a manufacturing method thereof.

(2) Description of the Related Art

Hetero-junction bi-polar transistors (HBT), which utilize semiconductors with large bandgaps in emitters, are high-frequency analogue devices used in cellular phones and the like. In particular, InGaP/GaAs HBTs that use InGaP in emitters have low temperature dependence, and methods of using InGaP/GaAs HBTs for highly reliable devices are expected to continually multiply.

HBTs can be distinguished between an emitter-up type and a collector-up type. Generally, since the emitter-up type is superior to the collector-up type in processability, HBTs of the emitter-up type are presently mass produced. The HBTs of the collector-up type can decrease the base-collector capacity (Cbc) and is superior in this characteristic. However, since the emitter layer under the base electrode must be insulated and the manufacturing processes are complicated, the HBTs of the collector-up type have not been practically implemented.

Additionally, research and development have advanced for integrated circuits which integrate an HBT and an HFET that control a power amplifier (PA) including the HBT, using a switch device (SW) including the hetero-junction electric field effect transistor and the like. Thus, Bi-HFET process technology which forms an HBT and an HFET on the same substrate has attracted attention.

As the conventional Bi-HFET technology, there is a technology described for example in Japanese Unexamined Patent Application Publication No. 6-209077 in which an HBT and an HFET are formed on the same substrate. The prior art is described using the diagram below.

FIG. 1 is a cross section image which shows the structure of a conventional semiconductor device.

The semiconductor device has a region in which an HBT is formed (HBT region) and a region in which an HFET is formed (HFET region).

First, in the HBT region, an n-GaAs emitter cap layer 501, an n-AIGaAs emitter layer 502, a p-GaAs base layer 503, a non-doped GaAs collector layer 504a, an n-AlGaAs sub-collector layer 505a having a band gap larger than a band gap of the collector layer 504a, and an n-InGaAs collector cap layer 506 are sequentially laminated on a semi-insulating GaAs substrate 500.

On the other hand, in the HFET region, the emitter cap layer 501, the emitter layer 502, and the base layer 503 are sequentially formed on the semi-insulating GaAs substrate 500. Further, the following layers are sequentially laminated on the base layer 503, namely: a non-doped GaAs collector layer 504c which is positioned apart from the collector layer 504a, is made of the same material as the collector layer 504a, and on which a channel layer 504b is formed; an electron donor layer 505b made of the same material as the sub-collector layer 505a which is positioned apart from the sub-collector layer 505a; and a collector cap layer 506.

A method for manufacturing the semiconductor device which includes the above structure includes a step of etching the collector cap layer 506 into a predetermined shape, thus exposing a surface of an n-AIGaAs layer. Additionally, the method includes: a step of etching the n-AIGaAs layer and the non-doped GaAs layer into a predetermined shape, thus: forming the sub-collector 505a, the electron donor layer 505b that is positioned apart from the sub-collector 505a, the collector layer 504a, and the collector layer 504c that is positioned apart from the collector layer 504a; and exposing a surface of the base layer 503. Additionally, the method includes a step of etching the base layer 503 and the emitter layer 502 into a predetermined shape.

In the HBT region, a collector electrode 511, a base electrode 512, and an emitter electrode 513 are formed on the collector cap layer 506, the base layer 503, and the emitter cap layer 501 respectively. On the other hand, in the HFET region, a source electrode 514 and a drain electrode 516 are formed on the collector cap layer 506, and a gate electrode 515 is formed on the electron donor layer 505b.

SUMMARY OF THE INVENTION

However in the conventional semiconductor device, there are the following problems.

There is an emitter cap layer which is activated under a base electrode in the HBT region. When a forward bias is applied to a base of the transistor, the current runs from the emitter to the base. This causes the current amplification factor (hfe) to decrease and the character of a bipolar transistor to deteriorate.

An electric field concentration occurs and the breakdown voltage of the collector decreases in the HBT region, since a channel layer of high impurity concentration is formed in the collector layer. When materials with a small band gap such as InGaAs are used in an activation layer (for example, channel 504b in FIG. 1), the semiconductor device becomes more prone to breakdowns due to electric field concentrations.

Further, in the HBT region there is a need to adequately increase the impurity concentration of the n-AIGaAs sub-collector layer in order to reduce the HBT collector resistance. However in this case, since the electron donor layer is made of the same material as the sub-collector layer, the impurity concentration of the electron donor layer increases and the breakdown voltage of the HFET gate and drain decreases. On the contrary, when the sub-collector layer has a low impurity concentration, the collector resistance of the HBT worsens.

Thus the present invention has been conceived in view of the problems and has a first object of providing a semiconductor device and a manufacturing method thereof which are capable of preventing decreases in the breakdown voltage of the collector, and reducing the resistance of the collector.

Additionally, the present invention has a second object of providing a semiconductor device with a high hfe and a manufacturing method thereof.

In order to achieve the aforementioned objects, the semiconductor device according to the present invention includes: a hetero-junction bipolar transistor formed on a first region of a semiconductor substrate; and a field effect transistor formed on a second region of the semiconductor substrate, wherein the hetero-junction bipolar transistor includes an emitter layer of a first conductivity, a base layer of a second conductivity, a collector layer of the first conductivity or a non-doped collector layer, and a sub-collector layer of the first conductivity which are formed sequentially on the first region, the base layer has a band gap smaller than a band gap of the emitter layer, and the field effect transistor includes an electron donor layer including a part of the emitter layer, and a channel layer formed under the electron donor layer.

Thus, the channel layer in the field effect transistor is not formed in the collector layer because the channel layer is formed under the electron donor layer, in other words, under the emitter layer, thus the channel layer differs from that of a conventional semiconductor device. Accordingly, an electric field concentration does not occur in the hetero-junction bipolar transistor and decreases in the breakdown voltage of the collector can be prevented.

Additionally, the electron donor layer is not made up of a part of the sub-collector layer as in a conventional semiconductor device, and is instead made up of a part of the emitter layer. Accordingly, by decreasing the doping amount in the electron donor layer, the breakdown voltage of the gate and the drain in the field effect transistor can be raised, the impurity concentration in the sub-collector layer can be sufficiently increased, and the collector resistance in the hetero-junction bipolar transistor can be decreased.

Additionally, the collector-up type hetero-junction bipolar transistor superior in a high frequency characteristic and a hetero-junction type field effect transistor with the same high-frequency characteristic can be formed on the same substrate.

The hetero-junction bipolar transistor may further include an emitter region of the first conductivity formed in the first region, an emitter electrode contacting the emitter region, and a base electrode contacting the base layer. The field effect transistor further may include a source region of the first conductivity and a drain region of the first conductivity which are formed in the second region, and the emitter region may be formed in a portion other than a portion positioned under the base electrode in the first region.

Thus, an emitter region is not formed on a portion positioned under the base electrode in the semiconductor substrate, and the portion is depleted since an ion species is not implanted on it. Accordingly, hole injection from the base to the emitter can be prevented and a high-performance hetero-junction bipolar transistor with a high hfe can be realized.

The field effect transistor may further include a source electrode contacting the source region and a drain electrode contacting the drain region, and the source electrode, the drain electrode, and the emitter electrode may be made of a same material.

Thus, the emitter electrode, the source electrode, and the drain electrode can be formed at the same time, and there is no need to add new steps. Accordingly, the process costs can be reduced.

Furthermore, the emitter electrode, the source electrode, and the drain electrode may be formed by thermal diffusion of the material, after the material is formed on the emitter layer and the electron donor layer.

Thus a step of etching the emitter layer can be omitted and process costs can be further reduced.

Furthermore, the field effect transistor further may include a gate electrode, and the base electrode and the gate electrode may be made of a same material. Furthermore, the gate electrode may be formed on the electron donor layer.

Thus, the base electrode and the gate electrode can be formed at the same time, and there is no need to add new steps. Accordingly, the process costs can be reduced.

Furthermore, the field effect transistor may further include a gate electrode, and the gate electrode may be made of a same material of a part of the base layer and of the base electrode, and may be formed on the electron donor layer.

Thus an HFET having a p-n junction gate can be formed and an enhanced mode HFET (E-HFET) with high current driving power can be formed.

Furthermore, the present invention can be applied to the method for manufacturing a semiconductor device including: forming a channel layer by epitaxially growing a semiconductor layer in which an ion species of a first conductivity is implanted on a semiconductor substrate; implanting the ion species of the first conductivity in the semiconductor substrate; forming a source region, a drain region, and an emitter region which are of the first conductivity, by activating, using annealing, a portion of the semiconductor substrate in which the ion species has been implanted; and sequentially and epitaxially growing, on the channel layer, an emitter layer of the first conductivity, a base layer of a second conductivity having a band gap smaller than a band gap of the emitter layer, and a collector layer of the first conductivity or a non-doped collector layer.

Thus, it is possible to realize a method for manufacturing a semiconductor device which can prevent decreases in the breakdown voltage of the collector and which can reduce the collector resistance.

Here, in the forming of the source electrode, the drain electrode, and emitter electrode, after forming an AuGe/Au-based metal on the emitter layer, the emitter electrode, the source electrode, and the drain electrode may be formed at the same time by thermally diffusing the metal from a top of the emitter layer so that the metal ohmically contacts the emitter region, the source region, and the drain region.

In this way, the emitter electrode, the source electrode, and the drain electrode can be formed at the same time, there is no need to add new steps, and the process costs can be reduced.

Furthermore, in the forming of the base electrode and the gate electrode, the base electrode and the gate electrode which are made of a single layer film or a laminated film may be formed at the same time, the film including Pt.

In this way, the base electrode and the gate electrode can be formed at the same time, there is no need to add new steps, and the process costs can be reduced.

Furthermore, in the exposing, a part of the base layer may be removed such that a portion positioned between the source region and the drain region in the base layer remains, and in the forming of the base electrode and the gate electrode, a gate electrode made of a single layer film or a laminated film may be formed on the base layer positioned between the source region and the drain region, the film including Pt.

Thus a method for manufacturing a semiconductor device having an E-FET can be achieved.

According to the present invention, it is possible to form a Bi-HFET which can prevent decreases in the breakdown voltage of the collector and which can reduce the collector resistance. Additionally, a high hfe Bi-HFET can be formed.

Additionally, by using a conventional GaAs process, there is mostly no need to add new steps, and a high-performance collector-up type HBT, and an HFET with two Vt modes, a depletion mode and an enhance mode, can be formed on the same substrate.

Additionally, according to the present invention, a Bi-HFET that is superior in high frequency characteristics and in processability can be formed, in comparison to a conventional Bi-HFET.

FURTHER INFORMATION ABOUT TECHNICAL BACKGROUND TO THIS APPLICATION

The disclosure of Japanese Patent Application No. 2007-148638 filed on Jun. 4, 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Below, the HBT and HFET integrated circuit (Bi-HFET) and the manufacturing method thereof in the embodiments of the present invention are described with reference to the diagrams.

First Embodiment

Figure 1:
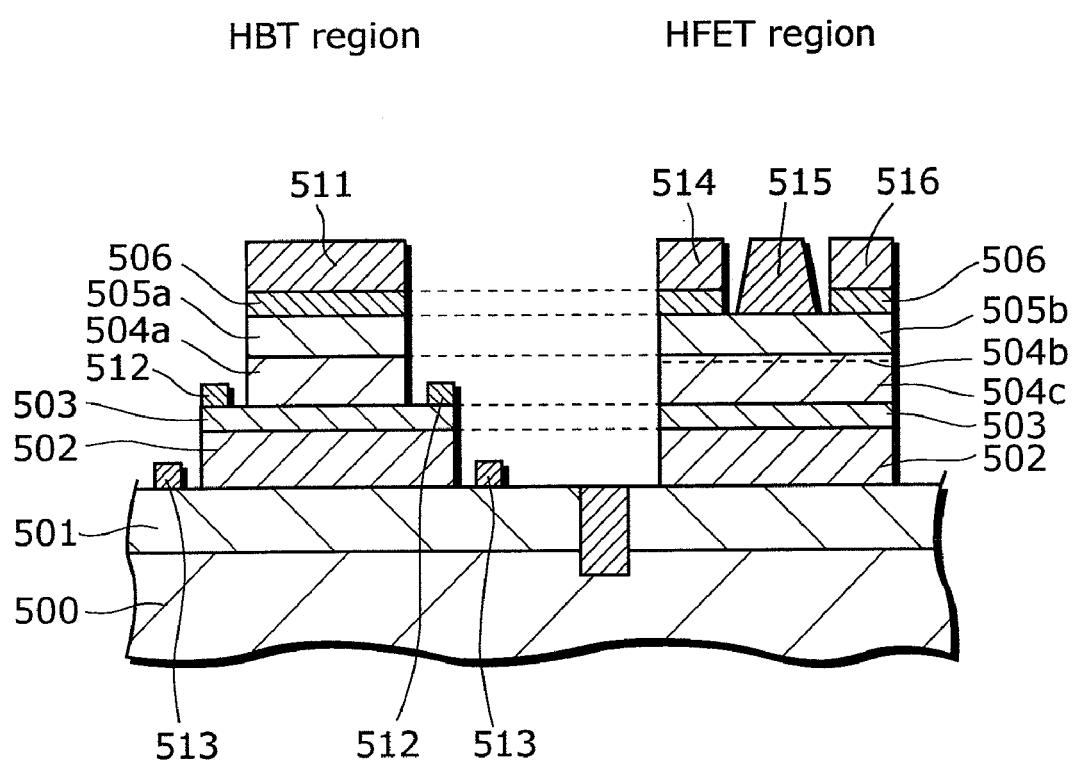
FIG. 1 is a diagram which shows an example of a conventional semiconductor device.
Figure 2A:
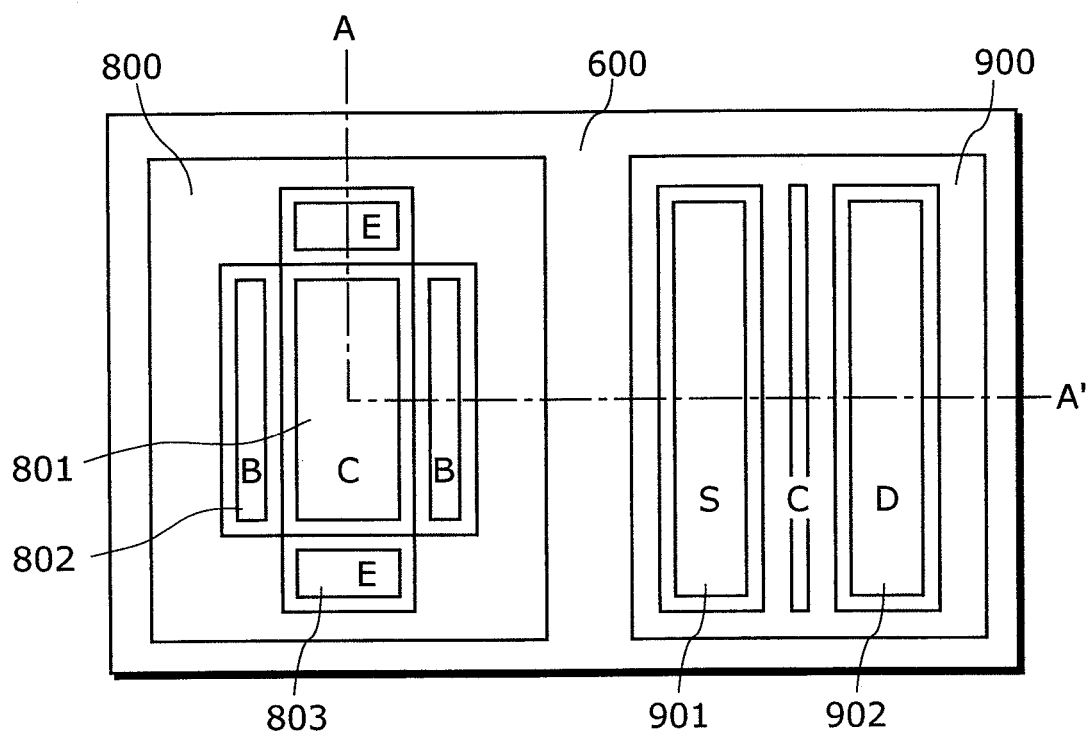
FIG. 2A is an overhead diagram which shows the structure of the HBT and HFET integrated circuit according to the first embodiment of the present invention.
Figure 2B:
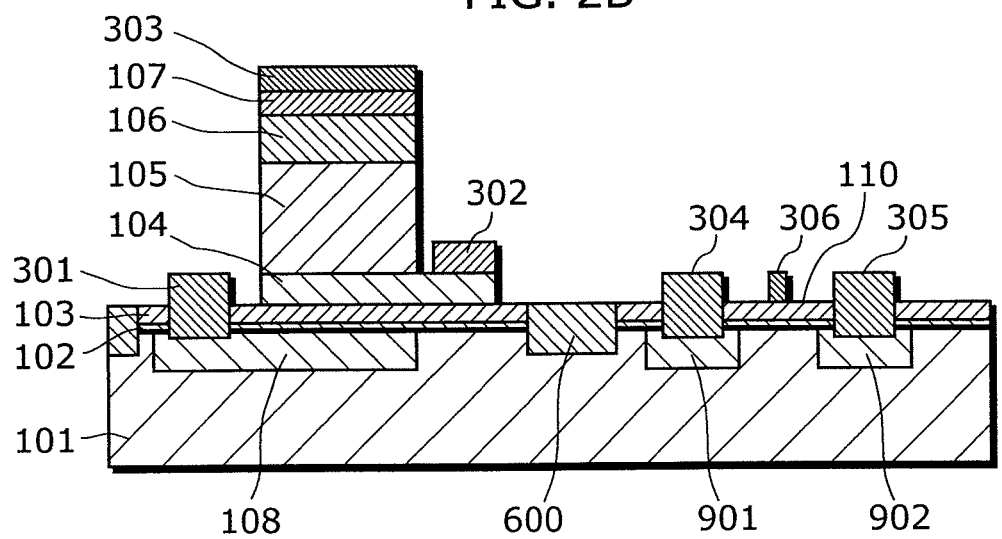
FIG. 2B is a cross-section diagram which shows the structure of the integrated circuit (the cross section diagram along the line A-A' in FIG. 2A)

FIG. 2A is an overhead diagram which shows the structure of the HBT and HFET integrated circuit according to the first embodiment of the present invention. FIG. 2B is a cross section diagram which shows the structure of the same integrated circuit (the cross section diagram along the line A-A' in FIG. 2A).

The integrated circuit includes a region (HBT region) 800 which functions as a collector-up type HBT, and a region (HFET region) 900 which functions as an HFET.

A channel layer 102 of a first conductivity, an emitter layer 103 of the first conductivity, a base layer 104 of a second conductivity with a band gap smaller than that of the emitter layer 103, a low impurity concentration collector layer 105 or a non-doped collector layer 105 which is of the first conductivity, a sub-collector layer 106 which is of the first conductivity and is doped with a impurity concentration higher than that of the collector layer 105, and a collector cap layer 107 on which a collector electrode 303 is formed are formed sequentially on the first region on which the HBT is formed in the semi-insulating GaAs substrate layer 101. Note that n-type is an example of the first conductivity and p-type is an example of the second conductivity in the present invention.

More specifically, the channel layer 102 made of InGaAs in which an n-type uniformly doped layer or a δ doped layer is formed, is formed on the first region by epitaxial growth. The emitter layer 103 that is made of InGaP and is doped in n-type to $1 \times 10^{17}$ cm$^{-3}$ with a thickness of 30 nm, a base layer 104 that is made of GaAs and is doped in p-type to $4 \times 10^{19}$ cm$^{-3}$ with a thickness of 100 nm, the collector layer 105 that is made of GaAs and is doped in n-type to $1 \times 10^{16}$ cm$^{-3}$ with a thickness of 600 nm, the sub-collector layer 106 that is made of GaAs and is doped in n-type to $5 \times 10^{18}$ with a thickness of 30 nm, the collector cap layer 107 that is made of InGaAs and is doped in n-type to more than $1 \times 10^{18}$ with a thickness of 50 nm are sequentially laminated on the channel layer 102.

The collector cap layer 107, the sub-collector layer 106, and the collector layer 105 are etched to a mesa shape, forming a collector region 801 on the HBT region 800. The base layer 104 is etched to a mesa shape, forming the base region 802. The emitter layer 103 and the emitter contact region 108 form an emitter region 803. The emitter contact region 108 is formed by implanting, for example, Se ions into the semi-insulating GaAs substrate 101 and activating, in n-type, a portion of the substrate in which the ions have been implanted. An emitter electrode 301 contacting the emitter contact region 108 is formed on the emitter contact region 108 by thermally diffusing AuGe/Ni/Au from a top of the emitter layer 103, and a base electrode 302 that is a non-alloy Pt/Ti/Pt/Au and that contacts the base layer 104 is formed on the base layer 104. The collector electrode 303 contacting the collector cap layer 107, for example, a collector electrode made of WSi is formed on the collector cap layer 107 which is in the collector region 801. The emitter contact region 108 is formed in a portion other than a portion positioned under the base electrode 302 in the first region in the semi-insulating GaAs substrate 101. Note that the emitter contact region 108 is an example of an emitter region in the present invention.

On the other hand, the channel layer 102 of the first conductivity and the electron donor layer 110 of the first conductivity are formed sequentially on the second region in which the HFET is formed on the semi-insulating GaAs substrate 101.

More specifically, the channel layer 102 that includes an n-type uniformly doped layer or a δ doped layer and is made of InGaAs is formed on the second region by epitaxial growth. Additionally, the n-type electron donor layer 110 including a part of the emitter layer 103 is laminated on the channel layer 102.

On the HFET region 900; the collector cap layer 107, the sub-collector layer 106, the collector layer 105, and the base layer 104 are removed; the electron donor layer 110 made of the same material as that of the emitter layer 103, and a channel layer 102 positioned under the electron donor layer 110 are formed; and a gate electrode 306 is formed on the electron donor layer 110. Se ions are for example implanted into the semi-insulating GaAs substrate 101, and a portion of the substrate is activated in n-type, forming the source region 901 and the drain region 902. A source electrode 304 ohmically contacting the source region 901 and a drain electrode 305 ohmically contacting the drain region 902 are formed by thermally diffusing AuGe/Ni/Au from a top of the emitter layer 103. A gate electrode 306 is positioned between the source region 901 and the drain region 902. The gate electrode 306 is formed by schottky contacting of Pt/Ti/Pt/Au with the InGaP layer, i.e. the electron donor layer 110.

Although not illustrated, an inter-layer film is formed on each electrode described above and further, contact holes are formed on the inter-layer film, and through these holes, wiring is formed in order to connect to the electrode.

A device isolation region 600 is formed by implanting ions such as an He ion species and the like in the region between the HBT region 800 and the HFET region 900. The HBT and HFET are electrically isolated by the device isolation region 600 and their mutual electric effects are removed. For example, the channel layer 102 is electrically isolated from the HBT. Note that the device isolation region 600 may be formed between the HBT region 800 and the HFET region 900 not only by implanting ions therebetween but also by forming a mesa isolation region therebetween.

Given the structure above, the collector-up HBT which has a superior high frequency characteristic, and a hetero-junction field effect transistor with the same superior high frequency characteristic can be formed on the same substrate.

According to the integrated circuit in the present embodiment above, since the HFET channel layer is formed under the electron donor layer, in other words, under the emitter layer, a channel layer is not formed in the collector layer, unlike a conventional semiconductor device. Therefore, decreases in the breakdown voltage of the collector can be prevented without a concentration of electric fields being generated in the HBT region.

According to the integrated circuit in the present embodiment, there is no ion-implanted portion formed under the portion at which the base electrode is formed in the base layer and the portion is depleted, in the structure in which the HBT and the HFET are formed on the same substrate. Accordingly, since hole injection from the base to the emitter can be prevented, an HBT with a high hfe can be realized.

Additionally, given the integrated circuit according to the present embodiment, the electron donor layer is not formed by a portion of the sub-collector layer as in a conventional semiconductor device; instead the electron donor layer is structured by a portion of the emitter layer. Accordingly, by setting the doping amount of the electron donor layer to less than $1 \times 10^{18}$ cm$^{-3}$, the breakdown voltage of the gate and drain in the HFET can be raised and the collector resistance can be decreased by sufficiently increasing the impurity concentration of the sub-collector layer.

Additionally, given the integrated circuit according to the present invention, the HBT and the HFET are electrically isolated by implanting an ion species or by mesa isolation. Thus since there is only a thin channel layer between the HBT and the HFET, the separation between devices can be easily realized using ion implantation by way of a low voltage acceleration or a rough mesa isolation.

Figure 3:
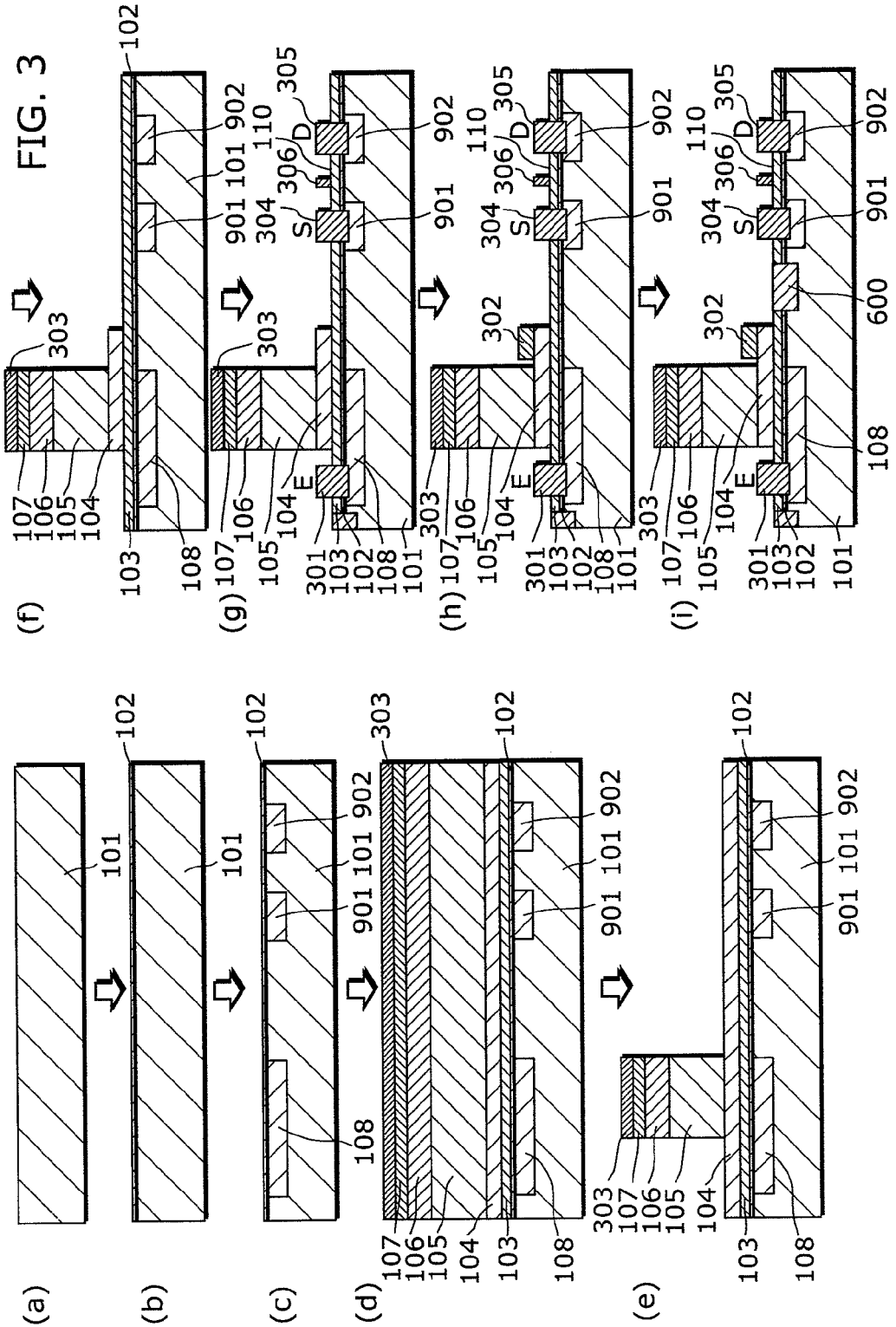
FIG. 3 is a cross-section diagram for describing sequential steps of a method for manufacturing the integrated circuit.

Next, a method for manufacturing the integrated circuit including the above structure is described in detail using FIG. 3. FIG. 3 is a cross-section diagram for describing sequential steps of a method for manufacturing the integrated circuit.

First, a channel layer 102 made of InGaAs, in which an n-type uniformly doped layer or a δ doped layer is formed, is formed on the semi-insulating GaAs substrate 101 by epitaxial growth (FIGS. 3(a) and (b)).

Next, an n-type ion species which functions as an n-type carrier such as Si ions, Te ions, or Se ions is implanted into a predetermined region of the semi-insulating GaAs substrate 101 on which the emitter contact region 108, the source region 901, and the drain region 902 are to be formed. For example, the ion species is implanted at an acceleration voltage of 30 keV and with a dose amount of 1 E14 cm$^3$.

Next, the region in which the ions species has been implanted is activated by thermal processing (annealing), thus forming the emitter contact region 108, the source region 901, and the drain region 902 (FIG. 3(c)). In the method for manufacturing the integrated circuit in the present embodiment, the crystallinity of the InGaAs layer i.e. the channel layer 102 does not deteriorate for the most part, since thermal processing is performed using a rapid cooling process by lamp annealing.

Next, the emitter layer 103 made of InGaP which is doped in n-type to $1 \times 10^{17}$ cm$^{-3}$ with a thickness of 30 nm, the base layer 104 made of GaAs which is doped in p-type to $4 \times 10^{19}$ cm$^{-3}$ with a thickness of 100 nm, the collector layer 105 made of GaAs which is non-doped or doped in n-type to $1 \times 10^{16}$ cm$^{-3}$ with a thickness of 600 nm, the sub-collector layer 106 made of GaAs which is doped in n-type to high impurity concentration of $5 \times 10^{18}$ cm$^{-3}$ with a thickness of 30 nm, and the collector cap layer 107 made of InGaAs which is doped in n-type to more than $1 \times 10^{18}$ cm$^{-3}$ with a thickness of 50 nm are sequentially laminated onto the semi-insulating GaAs substrate 101 by epitaxial growth. Subsequently, WSi is sputtered onto the collector cap layer 107, so that the collector electrode 303 is formed (FIG. 3(d)).

Next, a photoresist pattern is formed, and the collector electrode 303, the collector cap layer 107, the sub-collector layer 106, and the collector layer 105 are etched to a predetermined shape, and the base layer 104 is exposed on the surface, forming the collector electrode 303 and the collector region (FIG. 3(e)).

Next, the base layer 104 is etched to a predetermined shape and the emitter layer 103 is exposed on the surface, forming the base region. For the etching in the base layer 104, wet etching is utilized as an etching method and a phosphoric acid based material is used as the etchant. Accordingly, a high selection ratio between the base layer 104 and the InGaP layer i.e. the emitter layer 103 can be obtained, and a high processing reproducibility can be obtained (FIG. 3(f)).

Next, an AuGe/Ni/Au metal is formed by a vapor deposition lift-off method above a portion of the InGaP layer i.e. the emitter layer 103 on which the emitter contact region 108, the source region 901, and the drain region 902 are formed, thereby forming the emitter electrode 301, the source electrode 304, and the drain electrode 305. Subsequently, the AuGe/Ni/Au metal on the emitter layer 103 is thermally diffused by thermal processing, and an ohmic contact is formed between a predetermined region in the semi-insulating GaAs substrate 101 activated after implantation of the ion species and each of the electrodes, in other words, the emitter contact region 108, the source region 901, and the drain region 902 (FIG. 3(g)). The InGaP layer i.e. the emitter layer 103 inserted between the source electrode 304 and the drain electrode 305 serves as the electron donor layer 110. With this step, the emitter electrode 301, the source electrode 304, and the drain electrode 305 which are made of the same materials are formed at the same time.

Next, a photoresist pattern is formed, and a laminated film made of Pt/Ti/Pt/Au each having a thickness of 30 nm, 50 nm, 50 nm, and 100 nm is formed by the vapor deposition lift-off method on the base layer 104 exposed on the surface in the base region and a portion on which the electron 306 is to be formed between the source region 901 and the drain region 902 in the InGaP layer i.e. the electron donor layer 110, forming the base electrode 302 and the gate electrode 306 (FIG. 3(h)).

Since non-alloy Pt ohmically contacts the p-GaAs included in the base layer 104, and Pt schottky contacts the n-InGaP of the electron donor layer 110, the base electrode 302 and the gate electrode 306 made of the same materials can be formed at the same time using this step. When the base electrode 302 and the gate electrode 306 have an electrode structure which includes Pt and Pd, each electrode ohmically contacts the base layer 104 and schottky contacts the electron donor layer 110. Accordingly, the materials made up of the base electrode 302 and the gate electrode 306 are not limited to Pt/Ti/Pt/Au as long as the materials are made up of a single film or a laminated film made of Pt or Pd.

Next, a photoresist pattern is formed, an He ion species is implanted in portions of the emitter layer 103 and the semi-insulating GaAs substrate 101 other than portions of the HBT region 800 and the HFET region 900, and the device isolation region 600 is formed. As a result, the devices are electrically isolated (FIG. 3(i)).

The processes which follow use a conventional method and thus no description is necessary, however, a collector-up type HBT superior in high frequency characteristic, and an HFET also superior in high frequency characteristic can be formed on a semi-insulating GaAs substrate at the same time by performing a step of forming a SiN film as an inter-layer film such that each transistor is covered, a step of opening a portion of the SiN film on which each electrode is formed, and a step of forming wiring for conducting electricity from each electrode in the opened portion of the SiN film.

In the same way as above, according to the method for manufacturing the integrated circuit in the present embodiment, the emitter contact region, the source region, and the drain region can be formed at the same time by performing the same ion implantation process and a thermal process, and the process costs can be reduced without having to add new steps.

Additionally, given the method for manufacturing the integrated circuit according to the present embodiment, since the emitter electrode, the source electrode, and the drain electrode are formed at the same time by forming AuGe/Ni/Au on the emitter layer using the vapor deposition lift-off method, and performing thermal process, there is no need to add new steps and the process costs can be reduced.

Additionally, according to the method for manufacturing the integrated circuit in the present embodiment, the emitter electrode, the source electrode, and the drain electrode are formed by thermally diffusing the metal from a top of the emitter layer. When an electrode is formed by thermal diffusion, leaving only the emitter layer, it is possible to simplify a step of etching the emitter layer and to further reduce the process costs.

Note that, in the method for manufacturing the integrated circuit according to the present embodiment, the emitter electrode, the source electrode, and the drain electrode are formed by thermally diffusing the metal from a top of the emitter layer. However, portions of the emitter layer 103 on which each electrode is formed may be removed by etching, and each electrode may be formed on the removed portions.

Second Embodiment

Figure 4:
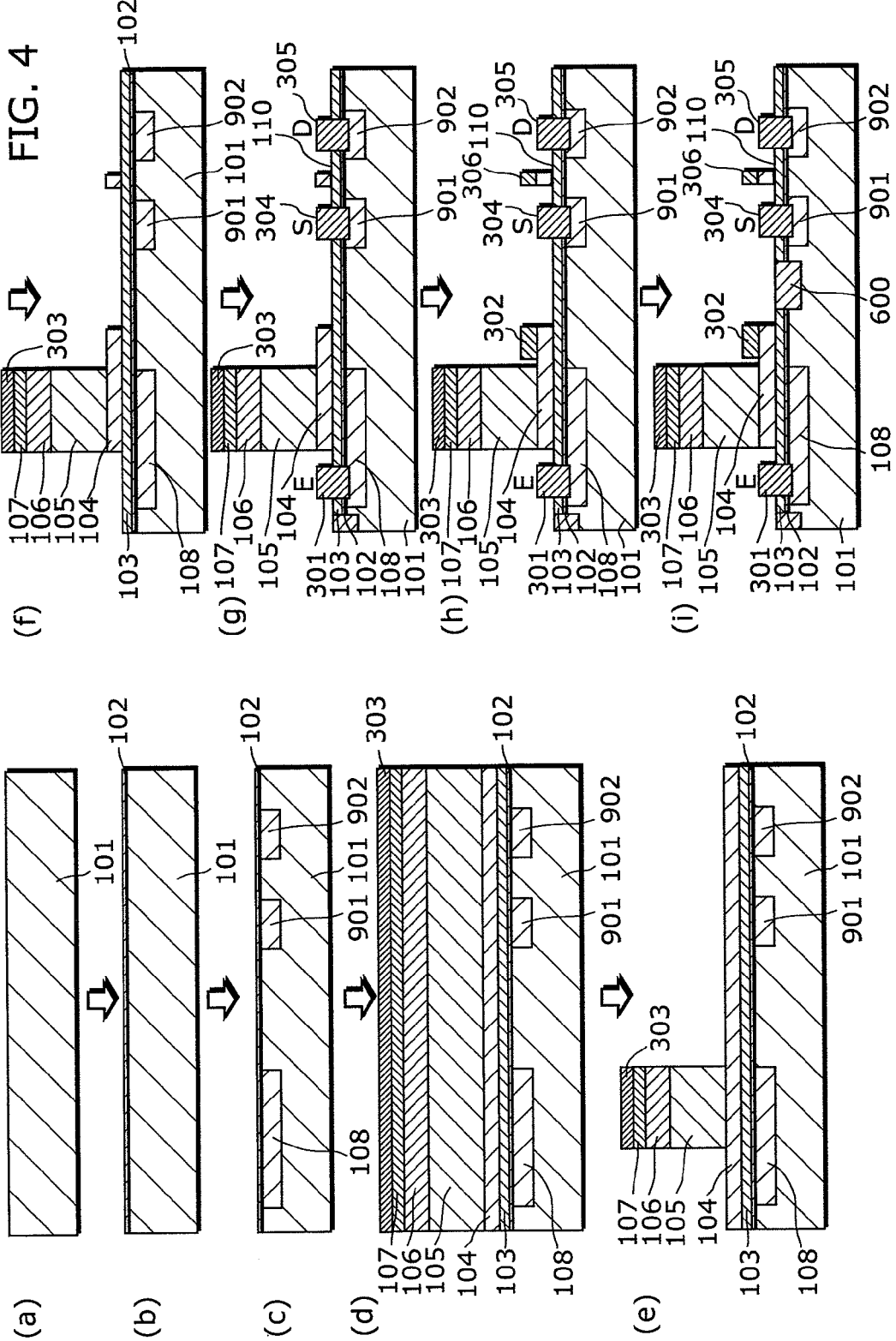
FIG. 4 is a cross-section diagram for describing sequential steps of a method for manufacturing the HBT and HFET integrated circuit according to the second embodiment of the present invention.

Next, a method for manufacturing the HBT and HFET integrated circuit according to the second embodiment of the present invention is described in detail using FIG. 4. FIG. 4 is a cross-section diagram for describing sequential steps of the method for manufacturing the integrated circuit.

First, the channel layer 102 made of InGaAs, in which an n-type uniformly doped layer or a δ doped layer is formed, is formed on the semi-insulating GaAs substrate 101 by epitaxial growth (FIGS. 4(a) and (b)).

Next, an ion species which functions as an n-type carrier such as an Se ion, is implanted in a predetermined region of the semi-insulating GaAs substrate 101 on which the emitter contact region 108, the source region 901, and the drain region 902 are to be formed on the semi-insulating GaAs substrate 101. For example, the ion species is implanted at an acceleration voltage of 30 keV and with a dose amount of $1 \times 10^{14}$ cm$^{-3}$.

Next, the region in which the ion species has been implanted is activated by thermal processing (annealing), thus forming an emitter contact region 108, a source region 901, and a drain region 902 (FIG. 4(c)). In the method for manufacturing the integrated circuit in the present embodiment, the crystallinity of the InGaAs layer i.e. the channel layer 102 does not deteriorate for the most part, since thermal processing is performed using a rapid cooling process by lamp annealing.

Next, the emitter layer 103 made of InGaP which is doped in n-type to $1 \times 10^{17}$ cm$^{-3}$ with a thickness of 30 nm, the base layer 104 made of GaAs which is doped in p-type to $4 \times 10^{19}$ cm$^{-3}$ with a thickness of 100 nm, the collector layer 105 made of GaAs which is non-doped or doped in n-type to $1 \times 10^{16}$ cm$^{-3}$ with a thickness of 600 nm, the sub-collector layer 106 made of GaAs which is doped in n-type to high impurity concentration of $5 \times 10^{18}$ cm$^{-3}$ with a thickness of 30 nm, and the collector cap layer 107 made of InGaAs doped in n-type to more than $1 \times 10^{18}$ cm$^{-3}$ with a thickness of 50 nm are sequentially laminated on the semi-insulating GaAs substrate 101 by epitaxial growth. Subsequently, WSi is spattered onto the collector cap layer 107, so that the collector electrode 303 is formed (FIG. 4(d)).

Next, a photoresist pattern is formed, and the collector electrode 303, the collector cap layer 107, the sub-collector layer 106, and the collector layer 105 are etched to a predetermined shape, and the base layer 104 is exposed on the surface, forming the collector electrode 303 and the collector region (FIG. 4(e)).

Next, the base layer 104 is etched to a predetermined shape, and the emitter layer 103 is exposed on the surface, forming the base region. Here, a portion of the base layer 104 is etched such that a portion of the base layer 104 positioned between the source region 901 and the drain region 902 is left, in other words, a portion of the base layer 104 positioned on the electron donor layer 110 on which the gate electrode 306 is formed is left. For the etching in the base layer 104, wet etching is utilized as an etching method and a phosphoric acid based material is used as the etchant. Accordingly, a high selection ratio between the base layer 104 and the InGaP layer i.e. the emitter layer 103 can be obtained, and a high processing reproducibility can be obtained (FIG. 4(f)).

Next, an AuGe/Ni/Au metal is formed by the vapor deposition lift-off method above a portion of the InGaP layer i.e. the emitter layer 103 on which the emitter contact region 108, the source region 901, and the drain region 902 are formed, thereby forming the emitter electrode 301, the source electrode 304, and the drain electrode 305. Subsequently, thermal processing is performed, thus, thermally diffusing the AuGe/Ni/Au metal on the emitter layer 103. Then, an ohmic contact is formed between each of the electrodes and a predetermined region in the semi-insulating GaAs substrate 101 which has been activated after implantation of the ion species, in other words, the emitter contact region 108, the source region 901, and the drain region 902 (FIG. 4(g)). The InGaP layer which is the emitter layer 103 inserted between the source electrode 304 and the drain electrode 305 serves as the electron donor layer 110. With this step, the emitter electrode 301, the source electrode 304, and the drain electrode 305 which are made of the same materials are formed at the same time.

Next, the photoresist pattern is formed, and a laminated film Pt/Ti/Pt/Au each having a thickness of 30 nm, 50 nm, 50 nm, and 100 nm is formed by the vapor deposition lift-off method on the base layer 104 exposed on the surface of the base region and on the p-GaAs layer i.e. the base layer 104 on the electron donor layer 110, in other words, on the base layer 104 positioned between the source region 901 and the drain region 902, forming the base electrode 302 and the gate electrode 306 (FIG. 4(h)).

Since non-alloy Pt ohmically contacts the p-GaAs made up of the base layer 104, the base electrode 302 with low contact resistance and the gate electrode 306 of the p-n junction FET can be formed at the same time using this step. This is because when the base electrode 302 and the gate electrode 306 have an electrode structure which includes Pt or Pd, each electrode ohmically contacts the base layer 104. Accordingly, the materials made up of the base electrode 302 and the gate electrode 306 are not limited to Pt/Ti/Pt/Au as long as the materials are a single layer film or a laminated film of Pt or Pd.

Next, a photoresist pattern is formed, an He ion species is implanted in portions of the emitter layer 103 and the semi-insulating GaAs substrate 101 other than portions of the HBT region 800 and the HFET region 900, the device isolation region 600 is formed, and the devices are electrically isolated (FIG. 4(i)).

The processes which follow use a conventional method and thus no description is necessary; therefore by performing a step of forming an SiN film as an inter-layer film such that each transistor is covered, a step of opening an portion of the SiN film in which each electrode is formed, and a step of forming wiring for conducting electricity from each electrode in the opened portion of the SiN film, a collector-up type HBT superior in high frequency characteristic, and an HFET also superior in high frequency characteristic can be formed at the same time on the semi-insulating GaAs substrate.

Given the method for manufacturing the integrated circuit according to the present invention as described above, the gate electrode is formed by vapor depositing the metal on the base layer which is left on the electron donor layer. Accordingly, an HFET including a p-n junction gate can be formed and an enhanced-mode HFET (E-HFET) with high current driving performance can be formed.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example in the above embodiments, the emitter layer is made of InGaP, however, as long as the emitter layer is made of a material with a large band gap, the invention is not limited to this and may be made of, for example, AlGaAs. The semiconductor substrate is made of semi-insulating GaAs in the embodiments. However, the present invention is not limited to this semiconductor substrate as long as the substrate is made of semiconductor materials, and can be made of, for example, an InP-based material, or a GaN-based material.

Additionally, in the above embodiments, the channel layer is made of InGaAs, however, the material for use in forming the two-dimensional electronic gas is not limited to this, and may be made up of, for example, GaAs.

Additionally, the materials, film thicknesses, electrode structures, and the like which are used in the above embodiments are just one of the examples, and the present invention is not limited to these.

Additionally, in the above embodiments, the integrated circuit on which the enhanced-mode HFET (E-FET) and HBT are formed on the same substrate, and the integrated circuit on which the depletion-mode HFET and HBT are formed on the same substrate are exemplified as semiconductor devices in the present invention. However, the semiconductor device in the present invention may be an integrated circuit with the E/D type HFET and HBT on which an enhanced-mode HFET and a depletion-mode HFET and HBT are formed on the same substrate.

Additionally, in the present embodiment, the HFET channel layer is formed by epitaxial growth, however, the HFET channel layer may be formed by ion implantation.

INDUSTRIAL APPLICABILITY

The present invention can be utilized as a semiconductor device, and particularly as a method and the like for manufacturing an HBT and HFET integrated circuit.

What is claimed is:

1. A semiconductor device, comprising:
a hetero junction bipolar transistor formed on a first region of a semiconductor substrate; and
a field effect transistor formed on a second region of the semiconductor substrate,
wherein said hetero junction bipolar transistor includes an emitter layer of a first conductivity type, a base layer of a second conductivity type, a collector layer of the first conductivity type or a non-doped collector layer, and a sub-collector layer of the first conductivity type which are formed sequentially on the first region,
said base layer has a band gap smaller than a band gap of said emitter layer, and
said field effect transistor includes an electron donor layer including a part of said emitter layer, and a channel layer formed under said electron donor layer, wherein said hetero junction bipolar transistor further includes an emitter contact region of the first conductivity type formed in said first region, an emitter electrode that contacts said emitter contact region, a base electrode that contacts said base layer, and a collector electrode that contacts said sub-collector layer, said base electrode being formed in a region distinct from a region on a line that connects said collector electrode and said emitter electrode in a plane view.

2. The semiconductor device according to claim 1, wherein said channel layer is formed by implanting an ion species of the first conductivity type.

3. The semiconductor device according to claim 1, wherein said channel layer is formed by epitaxially growing a semiconductor layer on the semiconductor substrate, the semiconductor layer being formed by implanting an ion species of the first conductivity type.

4. The semiconductor device according to claim 1, further comprising:
an isolation region which electrically isolates said channel layer in the second region from said hetero junction bipolar transistor, and
said isolation region is formed by implanting an ion species in the channel layer or by forming a mesa isolation region.

5. The semiconductor device according to claim 1, wherein said field effect transistor further includes a source electrode contacting a source region and a drain electrode contacting a drain region, and
said source electrode, a drain electrode, and said emitter electrode are made of a same material.

6. The semiconductor device according to claim 5, wherein said emitter electrode, said source electrode, and said drain electrode are formed by thermal diffusion of the material, after the material is formed on said emitter layer and said electron donor layer.

7. The semiconductor device according to claim 1, wherein said field effect transistor further includes a gate electrode, and
said base electrode and said gate electrode are made of a same material.

8. The semiconductor device according to claim 7, wherein said gate electrode is formed on said electron donor layer.

9. The semiconductor device according to claim 1, wherein said field effect transistor further includes a gate electrode, and
said gate electrode is made of a same material of a part of the base layer and of said base electrode, and is formed on said electron donor layer.

10. The semiconductor device according to claim 1, wherein the semiconductor substrate is made of GaAs, and said emitter layer is made of InGaP.

11. The semiconductor device according to claim 7, wherein the material of said base electrode and said gate electrode is a single layer film or a laminated film, the film including Pt.

12. The semiconductor device of claim 1, wherein said emitter contact region is formed using ion implantation and annealing.

13. The semiconductor device of claim 1, wherein said base layer is formed on said emitter layer in direct contact, a portion that overlaps said base electrode in the plane view being depleted, said portion being disposed under said base layer and including at least said emitter layer.

14. A semiconductor device, comprising:
a hetero junction bipolar transistor formed on a first region of a semiconductor substrate; and
a field effect transistor formed on a second region of the semiconductor substrate,
wherein said hetero junction bipolar transistor includes an emitter layer of a first conductivity type, a base layer of a second conductivity type, a collector layer of the first conductivity type or a non-doped collector layer, and a sub-collector layer of the first conductivity type which are formed sequentially on the first region,
said base layer has a band gap smaller than a band gap of said emitter layer, and
said field effect transistor includes an electron donor layer including a part of said emitter layer, and a channel layer formed under said electron donor layer,
wherein said hetero junction bipolar transistor further includes an emitter contact region of the first conductivity type formed in the first region, an emitter electrode that contacts said emitter contact region, a base electrode that contacts said base layer, and a collector electrode that contacts said sub-collector layer,
said base electrode being formed in a region distinct from a region between said collector electrode and said emitter electrode in a plane view.

15. A semiconductor device, comprising:
a hetero junction bipolar transistor formed on a first region of a semiconductor substrate; and
a field effect transistor formed on a second region of the semiconductor substrate,
wherein said hetero junction bipolar transistor includes an emitter layer of a first conductivity type, a base layer of a second conductivity type, a collector layer of the first conductivity type or a non-doped collector layer, and a sub-collector layer of the first conductivity type which are formed sequentially on the first region,
said base layer has a band gap smaller than a band gap of said emitter layer, and
said field effect transistor includes an electron donor layer including a part of said emitter layer, and a channel layer formed under said electron donor layer, wherein an emitter region of said hetero junction bipolar transistor includes an emitter layer and an emitter contact region that contact an emitter electrode of said hetero junction bipolar transistor, said emitter contact region being formed in a region distinct from a base electrode of said hetero-junction bipolar transistor in a plane view.

* * * * *